United States Patent
Yamanaka

(10) Patent No.: US 10,236,188 B2
(45) Date of Patent: Mar. 19, 2019

(54) ELECTROSTATIC NOZZLE, DISCHARGE APPARATUS, AND METHOD FOR MANUFACTURING SEMICONDUCTOR MODULE

(71) Applicant: TOYOTA JIDOSHA KABUSHIKI KAISHA, Toyota-shi, Aichi-ken (JP)

(72) Inventor: Atsuko Yamanaka, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 315 days.

(21) Appl. No.: 15/005,236

(22) Filed: Jan. 25, 2016

(65) Prior Publication Data

US 2016/0279650 A1 Sep. 29, 2016

(30) Foreign Application Priority Data

Mar. 25, 2015 (JP) .................... 2015-062894

(51) Int. Cl.
| | |
|---|---|
| *H01L 23/00* | (2006.01) |
| *H01L 21/56* | (2006.01) |
| *H01L 23/433* | (2006.01) |
| *B05B 5/043* | (2006.01) |
| *H01L 23/31* | (2006.01) |

(52) U.S. Cl.
CPC .............. *H01L 21/56* (2013.01); *B05B 5/043* (2013.01); *H01L 23/3135* (2013.01); *H01L 23/3142* (2013.01); *H01L 23/4334* (2013.01); *H01L 23/3107* (2013.01); *H01L 2224/32245* (2013.01); *H01L 2924/181* (2013.01)

(58) Field of Classification Search
CPC ..... B05B 5/043; H01L 21/56; H01L 23/3135; H01L 23/342; H01L 23/4334; H01L 23/3107; H01L 2224/32245; H01L 2924/181
USPC .................................................. 239/690–708
See application file for complete search history.

(56) References Cited

U.S. PATENT DOCUMENTS

| | | | | |
|---|---|---|---|---|
| 2,697,411 A | * | 12/1954 | Ransburg ................ | B05B 5/087 118/323 |
| 3,008,645 A | * | 11/1961 | Morel ...................... | B05B 5/04 118/626 |
| 3,317,138 A | * | 5/1967 | Fraser ...................... | B05B 5/03 239/402.5 |
| 3,539,103 A | * | 11/1970 | Marsh ...................... | B05B 5/03 174/47 |

(Continued)

FOREIGN PATENT DOCUMENTS

| | | |
|---|---|---|
| CN | 101116849 A | 2/2008 |
| CN | 201676782 U | 12/2010 |

(Continued)

*Primary Examiner* — Viet Le
(74) *Attorney, Agent, or Firm* — Oliff PLC

(57) ABSTRACT

An electrostatic nozzle includes a first pipe, a second pipe, and a third pipe. The first pipe is configured of a conductor. Voltage is applied on the first pipe by a power source. The second pipe is configured of an insulator and connected to the first pipe. The third pipe is configured of a metal, connected to the second pipe, insulated from the first pipe by the second pipe, and thinner than the second pipe. Liquid which has flown through the first pipe, the second pipe, and the third pipe is discharged from a distal end of the third pipe.

3 Claims, 3 Drawing Sheets

(56) References Cited

U.S. PATENT DOCUMENTS

| | | | | |
|---|---|---|---|---|
| 3,606,972 A * | 9/1971 | Ferrant | ............... | B05B 5/03 239/690.1 |
| 3,698,635 A * | 10/1972 | Sickles | ............... | B05B 5/043 239/3 |
| 3,774,844 A * | 11/1973 | Walberg | ............... | B05B 5/03 239/124 |
| 4,004,733 A * | 1/1977 | Law | ............... | B05B 5/043 239/106 |
| 4,073,002 A * | 2/1978 | Sickles | ............... | B05B 5/043 239/690.1 |
| 4,106,697 A * | 8/1978 | Sickles | ............... | B05B 5/043 239/291 |
| 4,335,419 A * | 6/1982 | Hastings | ............... | B05B 5/043 239/690.1 |
| 4,343,433 A * | 8/1982 | Sickles | ............... | B05B 7/068 239/3 |
| 4,347,984 A * | 9/1982 | Sickles | ............... | B05B 5/043 239/291 |
| 4,706,890 A * | 11/1987 | Talacko | ............... | B05B 5/032 239/426 |
| 4,735,364 A * | 4/1988 | Marchant | ............... | B05B 5/043 239/690.1 |
| 4,795,330 A * | 1/1989 | Noakes | ............... | A61M 15/02 425/6 |
| 5,534,309 A * | 7/1996 | Liu | ............... | B05B 12/02 118/688 |
| 5,765,761 A * | 6/1998 | Law | ............... | B05B 5/03 239/690.1 |
| 5,779,162 A * | 7/1998 | Noakes | ............... | B05B 5/053 239/290 |
| 5,916,640 A * | 6/1999 | Liu | ............... | B05B 5/043 239/698 |
| 5,992,771 A * | 11/1999 | Noakes | ............... | A61M 15/0045 136/255 |
| 6,220,533 B1 * | 4/2001 | Borner | ............... | B05B 5/032 239/690.1 |
| 6,227,466 B1 * | 5/2001 | Hartman | ............... | B05B 5/03 239/695 |
| 6,682,004 B2 * | 1/2004 | Kadlubowski | ............... | B05B 5/1691 239/332 |
| 6,814,318 B2 * | 11/2004 | Wilson | ............... | B05B 5/1691 239/690 |
| 6,860,434 B2 * | 3/2005 | Ahn | ............... | B01J 2/02 239/102.1 |
| 6,866,212 B2 * | 3/2005 | Sumiyoshi | ............... | B05B 5/1691 239/332 |
| 6,874,712 B2 * | 4/2005 | Milojevic | ............... | B05B 5/032 118/629 |
| 7,150,412 B2 * | 12/2006 | Wang | ............... | B05B 5/025 239/102.1 |
| 7,883,032 B2 * | 2/2011 | Davies | ............... | A61M 11/00 239/690 |
| 7,886,990 B2 * | 2/2011 | Scheer | ............... | F23D 11/38 239/290 |
| 8,448,883 B2 * | 5/2013 | Wada | ............... | B03C 3/12 239/102.1 |
| 8,453,952 B2 * | 6/2013 | Masuda | ............... | B05B 5/057 118/621 |
| 8,455,051 B2 * | 6/2013 | Renn | ............... | B05D 1/02 427/102 |
| 8,540,172 B2 * | 9/2013 | Waterman | ............... | B05B 5/0255 239/690.1 |
| 8,640,975 B2 * | 2/2014 | King | ............... | F23D 11/16 239/419 |
| 8,757,522 B2 * | 6/2014 | Tsuji | ............... | B05B 5/043 239/690.1 |
| 9,630,205 B2 * | 4/2017 | Ueno | ............... | B05D 1/007 |
| 2001/0038047 A1 * | 11/2001 | Wilson | ............... | B05B 5/1691 239/690 |
| 2001/0040195 A1 * | 11/2001 | Linger | ............... | B24C 5/04 239/690 |
| 2004/0251327 A1 * | 12/2004 | Messerly | ............... | B05B 1/265 239/690.1 |
| 2005/0116069 A1 * | 6/2005 | Murata | ............... | B05B 5/0255 239/690 |
| 2005/0236501 A1 * | 10/2005 | Zimlich, Jr. | ............... | A61M 15/0065 239/690 |
| 2006/0081728 A1 * | 4/2006 | Willey | ............... | B05B 1/044 239/690 |
| 2006/0097071 A1 * | 5/2006 | Robidoux | ............... | B05B 5/1683 239/302 |
| 2006/0202067 A1 * | 9/2006 | Mitsui | ............... | B05B 5/1608 239/690.1 |
| 2007/0200898 A1 * | 8/2007 | Ueno | ............... | B05B 5/0255 347/55 |
| 2007/0295841 A1 * | 12/2007 | Swenson | ............... | B05B 5/025 239/690 |
| 2008/0173327 A1 * | 7/2008 | Miyagi | ............... | B05B 5/03 134/1.3 |
| 2008/0308037 A1 * | 12/2008 | Bulovic | ............... | B05B 17/0638 118/302 |
| 2009/0045270 A1 * | 2/2009 | Muljono | ............... | B05B 5/035 239/690 |
| 2013/0009177 A1 * | 1/2013 | Chang | ............... | C23C 14/12 257/88 |
| 2013/0020418 A1 * | 1/2013 | Machi | ............... | C02F 1/48 239/690.1 |
| 2013/0189445 A1 * | 7/2013 | Jung | ............... | B05C 5/001 427/553 |
| 2014/0231981 A1 | 8/2014 | Kojima et al. | | |
| 2014/0377903 A1 * | 12/2014 | Takeda | ............... | C23C 14/042 438/99 |
| 2015/0125619 A1 * | 5/2015 | Ueno | ............... | B05B 5/0255 427/483 |
| 2015/0303151 A1 * | 10/2015 | Kobayashi | ............... | H01L 24/19 174/261 |
| 2017/0056901 A1 * | 3/2017 | Tani | ............... | B05B 5/043 |
| 2017/0341093 A1 * | 11/2017 | Hanzlik | ............... | B05B 1/34 |

FOREIGN PATENT DOCUMENTS

| | | |
|---|---|---|
| CN | 103843132 A | 6/2014 |
| JP | 2009-001873 A | 1/2009 |
| JP | 2011-151214 A | 8/2011 |
| JP | 2013-237002 A | 11/2013 |
| WO | 2013/172356 A1 | 11/2013 |

* cited by examiner

US 10,236,188 B2

ELECTROSTATIC NOZZLE, DISCHARGE APPARATUS, AND METHOD FOR MANUFACTURING SEMICONDUCTOR MODULE

CROSS-REFERENCE TO RELATED APPLICATION

This application claims priority to Japanese Patent Application No. 2015-062894 filed on Mar. 25, 2015, the entire contents of which are hereby incorporated by reference into the present application.

TECHNICAL FIELD

The technology disclosed in the present teaching relates to an electrostatic nozzle, a discharge apparatus, and a method for manufacturing a semiconductor module by utilizing the electrostatic nozzle.

DESCRIPTION OF RELATED ART

There has been known an electrostatic nozzle that electrically charges liquid, and applies the electrically-charged liquid to a workpiece. In many of the electrostatic nozzles, a main body of the electrostatic nozzle, including an end part, is configured of a metal. Voltage can be applied on the metal-made main body to thereby electrically charge the liquid that flows therethrough. In such an electrostatic nozzle, however, there may be a case where, when the electrostatic nozzle is made close to a workpiece, electric discharge occurs between the end part of the electrostatic nozzle and the workpiece.

On the other hand, Japanese Patent Application Publication No. 2013-237002 A discloses another electrostatic nozzle. This electrostatic nozzle has a tubular electrode, a tubular nozzle end part, and a power source. The tubular electrode is configured of a conductor. The tubular nozzle end part is configured of an insulator, and is connected to the tubular electrode. The power source applies voltage on the tubular electrode. In this electrostatic nozzle, liquid supplied from an outside flows through the tubular electrode and the tubular nozzle end part, and is discharged from the tubular nozzle end part. Since the power source applies voltage on the tubular electrode, the liquid is electrically charged when flowing through the tubular electrode. Accordingly, the liquid discharged from the tubular nozzle end part suitably attaches to the workpiece.

Furthermore, in this electrostatic nozzle, since the tubular nozzle end part is configured of an insulator, the electric discharge between the tubular nozzle end part and the workpiece can be prevented. Accordingly, in this electrostatic nozzle, the tubular nozzle end part can be made close to the workpiece, and the liquid can suitably be applied to the workpiece.

BRIEF SUMMARY

In the electrostatic nozzle in Japanese Patent Application Publication No. 2013-237002 A, the tubular nozzle end part is configured of an insulator, and hence has low stiffness. Accordingly, the tubular nozzle end part needs to be made thick. It was therefore difficult to apply liquid to a narrow gap (e.g., a thin, deep gap such as a trench). Accordingly, in the present specification, there is provided an electrostatic nozzle capable of preventing the electric discharge between the electrostatic nozzle and a workpiece, and applying liquid to a narrow gap.

An electrostatic nozzle disclosed herein comprises a first pipe, a second pipe, and a third pipe. The first pipe is configured of a conductor. Voltage is applied on the first pipe by the power source. The second pipe is configured of an insulator and connected to the first pipe. The third pipe is configured of a metal, connected to the second pipe, insulated from the first pipe by the second pipe, and thinner than the second pipe. Liquid which has flown through the first pipe, the second pipe, and the third pipe is discharged from a distal end of the third pipe.

In this electrostatic nozzle, the third pipe configures the end part of the nozzle. The third pipe is configured of a metal. Since the metal has stiffness higher than that of the insulator, the third pipe can be made thin. Therefore, according to this electrostatic nozzle, the end part of the nozzle (i.e., the third pipe) can be inserted into a narrow gap, to which the liquid can be applied. Furthermore, the third pipe is insulated from the first pipe by the second pipe. Accordingly, even if the third pipe is made close to the workpiece, the electric discharge between the third pipe and the workpiece can be prevented.

DETAILED DESCRIPTION OF INVENTION

Figure 1:
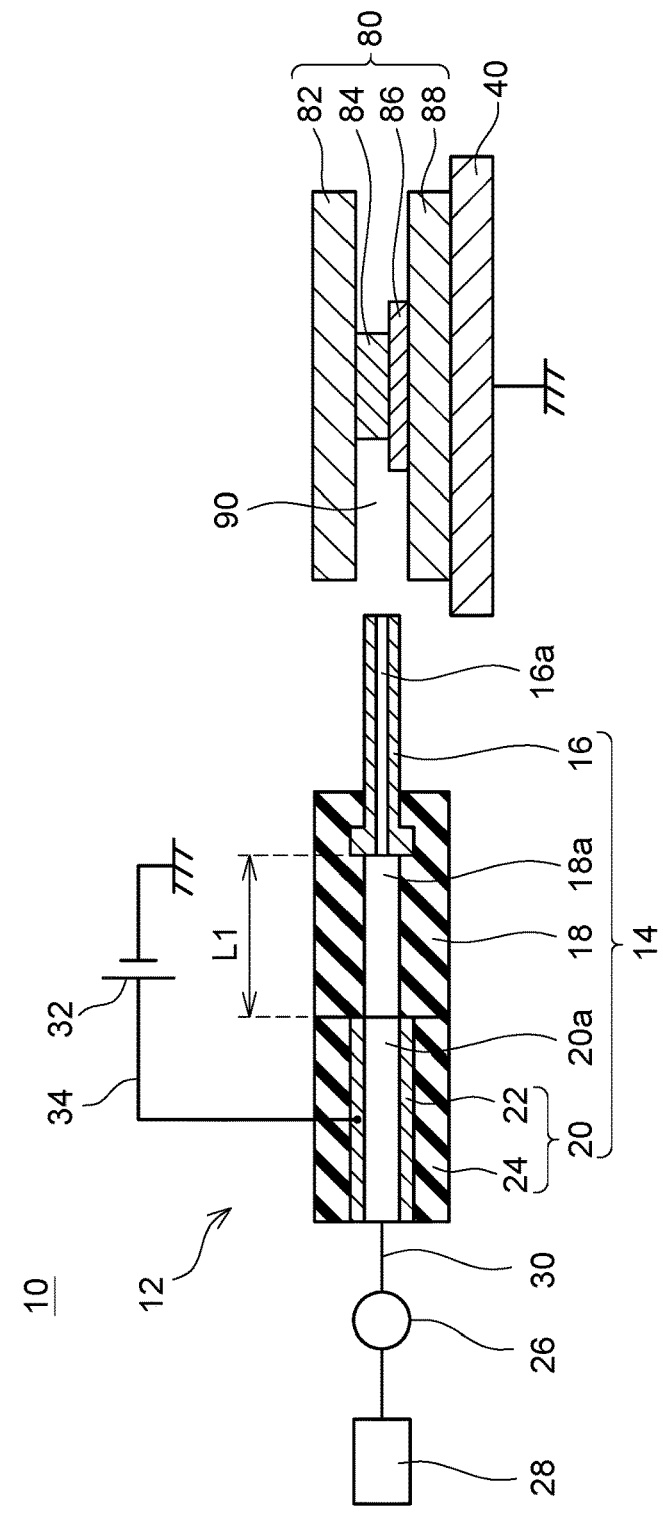
FIG. 1 shows an illustration of a resin applying apparatus 10.

A resin applying apparatus 10 shown in FIG. 1 comprises a discharge apparatus 12 and a stage 40. The resin applying apparatus 10 applies a primer to a surface of a semi-product 80 shown in FIG. 1, in a manufacturing process of a semiconductor module.

The discharge apparatus 12 comprises an electrostatic nozzle 14, a pump 26, a resin tank 28, and a direct current power source 32.

The electrostatic nozzle 14 has an distal-end nozzle part 16, an intermediate nozzle part 18, and a base-end nozzle part 20. The distal-end nozzle part 16 is a circular pipe configured of a metal. The intermediate nozzle part 18 is a circular pipe configured of an insulator. A base-end of the distal-end nozzle part 16 is embedded in a center hole 18a of the intermediate nozzle part 18. The distal-end nozzle part 16 is thereby connected to the intermediate nozzle part 18. A center hole 16a of the distal-end nozzle part 16 communicates with the center hole 18a of the intermediate nozzle part 18. A end part of the distal-end nozzle part 16 protrudes outwardly from the intermediate nozzle part 18. The end part of the distal-end nozzle part 16 has an outer diameter of smaller than 2 mm. The outer diameter of the distal-end nozzle part 16 is smaller than that of the intermediate nozzle part 18. In other words, the distal-end nozzle part 16 is thinner than the intermediate nozzle part 18.

The base-end nozzle part 20 comprises a tubular electrode 22 and an outer pipe 24. The tubular electrode 22 is a circular pipe configured of a metal. The outer pipe 24 is a circular pipe configured of an insulator. The length of the tubular electrode 22 is approximately equal to the length of the outer pipe 24. Furthermore, the entire tubular electrode 22 is embedded in a center hole of the outer pipe 24. Accordingly, the entire inner wall of a center hole 20a of the base-end nozzle part 20 is configured of the tubular electrode 22 (i.e., a metal). The base-end nozzle part 20 is connected to the intermediate nozzle part 18 in an axial direction. The base-end nozzle part 20 is connected to an end of the intermediate nozzle part 18 on a side opposite from the distal-end nozzle part 16. The center hole 20a of the tubular electrode 22 communicates with the center hole 18a of the intermediate nozzle part 18. The tubular electrode 22 is insulated from the distal-end nozzle part 16 by the intermediate nozzle part 18.

One end of a resin supply pipe 30 is connected to a base end of the base-end nozzle part 20. The other end of the resin supply pipe 30 is connected to the resin tank 28. A liquid primer is stored in the resin tank 28. The pump 26 is disposed at the resin supply pipe 30. When the pump 26 is operated, the primer in the resin tank 28 is fed to the electrostatic nozzle 14. The primer supplied to the electrostatic nozzle 14 flows in the center hole 20a of the base-end nozzle part 20, the center hole 18a of the intermediate nozzle part 18, and the center hole 16a of the distal-end nozzle part 16, and is discharged from a distal end of the distal-end nozzle part 16.

One end of a wiring 34 is connected to the tubular electrode 22 of the base-end nozzle part 20. The other end of the wiring 34 is grounded. The direct current power source 32 is interposed in the wiring 34. The direct current power source 32 applies voltage V1 (e.g., 10 kV) on the tubular electrode 22. A distance L1 between the tubular electrode 22 and the distal-end nozzle part 16, and a source material of the intermediate nozzle part 18 are selected such that breakdown voltage between the tubular electrode 22 and the distal-end nozzle part 16 is higher than the voltage V1 output from the direct current power source 32.

The stage 40 is configured of a metal. The stage 40 is grounded.

The semi-product 80 comprises a heatsink 82, a metal block 84, a semiconductor chip 86, and a heatsink 88. The heatsink 88 is configured of a metal. The semiconductor chip 86 is fixed at an upper surface of the heatsink 88. The semiconductor chip 86 is soldered to the heatsink 88. The metal block 84 is fixed at an upper surface of the semiconductor chip 86. The metal block 84 is soldered to the semiconductor chip 86. The heatsink 82 is fixed at an upper surface of the metal block 84. The heatsink 82 is configured of a metal. The heatsink 82 is soldered to the metal block 84. The heatsink 82 is in electrical conduction with the semiconductor chip 86 via the metal block 84.

As shown in the drawings, the sizes of the metal block 84 and the semiconductor chip 86 in a lateral direction (in a direction parallel to the upper surface of the semiconductor chip 86) is smaller than the sizes of the heatsinks 82 and 88 in the lateral direction. Accordingly, at a position where the metal block 84 and the semiconductor chip 86 do not exist, a space 90 is provided between the heatsinks 82 and 88. More specifically, the space 90 is provided between a lower surface of the heatsink 82 and the upper surface of the heatsink 88 that faces the lower surface. The lower surface of the heatsink 82, a side surface of the metal block 84, a side surface of the semiconductor chip 86, and the upper surface of the heatsink 88 are exposed to the space 90. The width of the space 90 in a vertical direction (i.e., the width between the lower surface of the heatsink 82 and the upper surface of the heatsink 88) is about 2 mm, which is larger than the outer diameter of the end part of the distal-end nozzle part 16.

Next, a method for manufacturing a semiconductor module from the semi-product 80 will be described. Initially, as shown in FIG. 1, the semi-product 80 is mounted on the stage 40. Since the stage 40 is grounded, the heatsink 88 that is in contact with the stage 40 is also grounded. Furthermore, since the semiconductor chip 86, the metal block 84, and the heatsink 82 are in electrical conduction with the heatsink 88, these are also grounded via the heatsink 88. In other words, approximately 0 V is applied on the entire semi-product 80.

Furthermore, the direct current power source 32 is turned on, and the voltage V1 is applied on the tubular electrode 22. Furthermore, the distal-end nozzle part 16 is inserted into the space 90 of the semi-product 80. Furthermore, the primer is supplied to the electrostatic nozzle 14 by the pump 26, and the primer is discharged from the distal end of the distal-end nozzle part 16. The primer is thereby applied to the surface of the semi-product 80 exposed in the space 90 (i.e., the lower surface of the heatsink 82, the side surface of the metal block 84, the side surface of the semiconductor chip 86, and the upper surface of the heatsink 88). Furthermore, when the voltage V1 is applied on the tubular electrode 22, the primer is positively charged when passing through the center hole 20a of the base-end nozzle part 20. The positively-charged primer is therefore discharged from the distal-end nozzle part 16. On the other hand, since approximately 0 V is applied on the semi-product 80, the primer discharged from the distal-end nozzle part 16 easily attaches to the surface of the semi-product 80. Accordingly, the primer can evenly be applied to the surface of the semi-product 80.

Furthermore, in this resin applying apparatus 10, the intermediate nozzle part 18 configured of an insulator is interposed between the distal-end nozzle part 16 that discharges the primer and the tubular electrode 22 on which the voltage V1 is applied. In other words, the intermediate nozzle part 18 insulates the distal-end nozzle part 16 from the tubular electrode 22. Therefore, even if the distal-end nozzle part 16 is made close to the semi-product 80, no electric discharge occurs between the distal-end nozzle part 16 and the semi-product 80. Accordingly, even if the distal-end nozzle part 16 is inserted into the narrow space 90, no electric discharge occurs between the distal-end nozzle part 16 and the semi-product 80. Accordingly, damages to the semiconductor chip 86, caused by the electric discharge, can be prevented.

Figure 2:
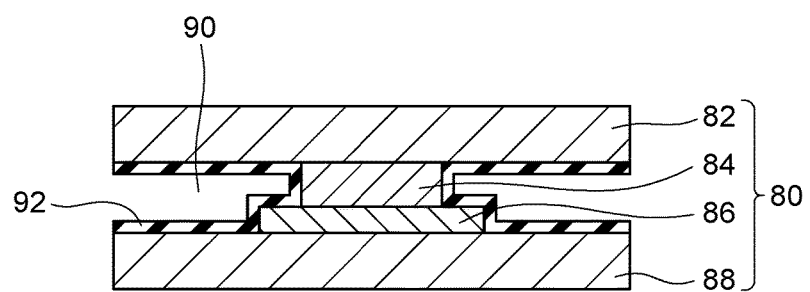
FIG. 2 shows a longitudinal cross section of a semi-product 80 to which a primer 92 is applied.

As described above, according to the electrostatic nozzle 14, the distal-end nozzle part 16 can be inserted into the narrow space 90 of the semi-product 80 while the electric discharge between the distal-end nozzle part 16 and the semi-product 80 being prevented. Accordingly, as shown in FIG. 2, the primer 92 can evenly be applied to the entire surface of the semi-product 80 exposed in the space 90 (i.e., the lower surface of the heatsink 82, the side surface of the metal block 84, the side surface of the semiconductor chip 86, and the upper surface of the heatsink 88).

Figure 3:
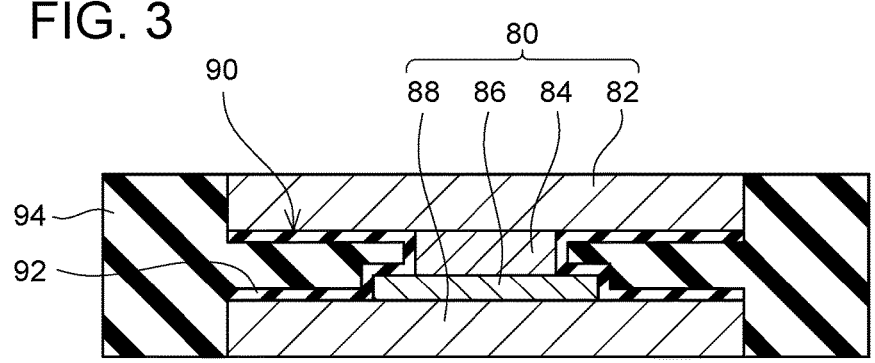
FIG. 3 shows a longitudinal cross section of a semiconductor module manufactured by a method according to an embodiment.

Next, as shown in FIG. 3, a resin layer 94 that covers the surface of the semi-product 80 is formed by injection molding. A semiconductor module is thereby completed. A resin thereby flows into the space 90 during the injection molding, and hence the resin layer 94 is also formed in the space 90. As described above, since the primer is applied to the surface of the semi-product 80 in the space 90 prior to the injection molding, the resin layer 94 suitably attaches to the surface of the semi-product 80 in the space 90. Therefore, according to this method, a highly reliable semiconductor module can be manufactured.

As described above, in the electrostatic nozzle 14 in the embodiment, the distal-end nozzle part 16 is configured of a metal, which has high stiffness. The metal-made distal-end nozzle part 16 can be made thinner than the intermediate nozzle part 18 configured of an insulator. Accordingly, with the electrostatic nozzle 14, the primer can suitably be applied to the thin, deep gap such as the space 90 described above. Furthermore, even if the distal-end nozzle part 16 is configured of a metal as such, the distal-end nozzle part 16 can be insulated from the tubular electrode 22 by the intermediate nozzle part 18 to thereby prevent the electric discharge between the distal-end nozzle part 16 and the semi-product 80.

Figure 4:
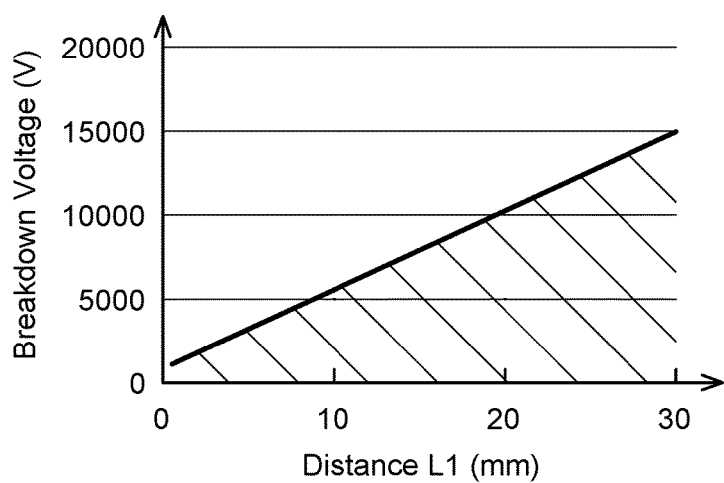
FIG. 4 shows a graph that shows a relation between breakdown voltage and a distance L1.

Note that FIG. 4 shows a relation between the breakdown voltage between the tubular electrode 22 and the distal-end nozzle part 16, and the distance L1. The distance L1 is preferably set such that the voltage V1 applied by the direct current power source 32 is lower than the breakdown voltage shown in FIG. 4. In other words, the voltage V1 and the distance L1 are preferably set within a hatched region in FIG. 4.

Furthermore, there may be a case where, as the electrostatic nozzle 14 is used, the distal-end nozzle part 16 becomes electrically charged. Accordingly, the distal-end nozzle part 16 may be connected to the ground regularly (such as immediately before the primer applying step) so as to electrically discharge electric charges from the distal-end nozzle part 16.

Note that, although the electrostatic nozzle 14 in the above-described embodiment discharges the primer it may discharge another resin. Furthermore, the electrostatic nozzle 14 may discharge liquid other than a resin.

The relation between a component of the embodiment and a component of the claims will hereinafter be described. The tubular electrode 22 in the embodiment is an example of the claimed first pipe. The intermediate nozzle part 18 in the embodiment is an example of the claimed second pipe. The distal-end nozzle part 16 in the embodiment is an example of the third pipe in the claims. The primer in the embodiment is an example of the claimed liquid.

The technological elements disclosed in the present specification will hereinafter be enumerated. Note that each technological element below is independently useful.

A discharge apparatus disclosed herein as an example, comprises an electrostatic nozzle and a power source. The electrostatic nozzle includes the first-third pipes described above. The power source is configured to apply voltage on the first pipe. The voltage output from the power source is lower than breakdown voltage between the first pipe and the third pipe.

A method disclosed herein as an example manufactures a semiconductor module from a semi-product. The semi-product comprises: two heatsinks facing each other; and a semiconductor chip disposed between the two heatsinks and connected to each of the two heatsinks. A space is provided between the two heatsinks. The method comprises a step of discharging the liquid from the electrostatic nozzle in a state where the third pipe is inserted into the space. The liquid is thus applied on at least a part of a surface exposing on the space.

The embodiments have been described in detail in the above. However, these are only examples and do not limit the claims. The technology described in the claims includes various modifications and changes of the concrete examples represented above. The technical elements explained in the present description or drawings exert technical utility independently or in combination of some of them, and the combination is not limited to one described in the claims as filed. Moreover, the technology exemplified in the present description or drawings achieves a plurality of objects at the same time, and has technical utility by achieving one of such objects.

What is claimed is:

1. An electrostatic nozzle, comprising:
    a first pipe made of a conductor and on which voltage is applied by a power source;
    a second pipe made of an insulator and connected to the first pipe; and
    a third pipe made of a metal, connected to the second pipe, and insulated from the first pipe by the second pipe, wherein an outer diameter of the third pipe is smaller than an outer diameter of the second pipe,
    wherein liquid which has flowed through the first pipe, the second pipe, and the third pipe is discharged from a distal end of the third pipe.

2. A discharge apparatus, comprising:
    the electrostatic nozzle of claim 1; and
    a power source configured to apply voltage on the first pipe,
    wherein the voltage output from the power source is lower than breakdown voltage between the first pipe and the third pipe.

3. A method for manufacturing a semiconductor module from a semi-product that comprises:
    two heatsinks facing each other; and
    a semiconductor chip disposed between the two heatsinks and connected to each of the two heatsinks, a space being provided between the two heatsinks,
    the method comprising discharging the liquid from the electrostatic nozzle of claim 1 in a state where the third pipe is inserted into the space.

* * * * *